United States Patent
Mizumoto et al.

(10) Patent No.: US 9,338,878 B2
(45) Date of Patent: May 10, 2016

(54) TOUCH PANEL

(75) Inventors: Hideaki Mizumoto, Moriyama (JP); Kunitomo Tsureyama, Moriyama (JP)

(73) Assignee: GUNZE LIMITED, Kyoto (JP)

( * ) Notice: Subject to any disclaimer, the term of this patent is extended or adjusted under 35 U.S.C. 154(b) by 66 days.

(21) Appl. No.: 14/344,593

(22) PCT Filed: Sep. 11, 2012

(86) PCT No.: PCT/JP2012/073147
§ 371 (c)(1),
(2), (4) Date: Jul. 28, 2014

(87) PCT Pub. No.: WO2013/039050
PCT Pub. Date: Mar. 21, 2013

(65) Prior Publication Data
US 2014/0360856 A1 Dec. 11, 2014

(30) Foreign Application Priority Data
Sep. 13, 2011 (JP) ................................ 2011-199865

(51) Int. Cl.
| | | |
|---|---|---|
| *H03K 17/975* | (2006.01) | |
| *H05K 1/02* | (2006.01) | |
| *G06F 3/044* | (2006.01) | |
| *G06F 1/16* | (2006.01) | |
| *H03K 17/96* | (2006.01) | |

(52) U.S. Cl.
CPC ................ *H05K 1/0213* (2013.01); *G06F 1/16* (2013.01); *G06F 3/044* (2013.01); *H03K 17/962* (2013.01); *G06F 2203/04112* (2013.01)

(58) Field of Classification Search
CPC ....... H03K 17/975; H01H 1/00; H01H 13/70; H01H 13/702–13/704; H01H 2239/074; H01H 2203/008; H01H 2207/01; H01H 2221/00; H01H 2231/002; H01H 2231/012; H01H 2231/016; H01H 2231/052; H01H 2239/006
USPC ..... 200/600, 46, 5 R, 5 A, 292, 243; 345/173
See application file for complete search history.

(56) References Cited

U.S. PATENT DOCUMENTS

| | | | | |
|---|---|---|---|---|
| 8,072,429 B2* | 12/2011 | Grivna | ................... | G06F 3/0416 345/173 |
| 8,493,337 B2* | 7/2013 | Liang | ...................... | G06F 3/044 345/173 |
| 2011/0102361 A1 | 5/2011 | Philipp | | |

FOREIGN PATENT DOCUMENTS

| | | |
|---|---|---|
| JP | 06-139005 A | 5/1994 |
| JP | 11-110115 A | 4/1999 |
| JP | 2004-086626 A | 3/2004 |
| JP | 2009-294815 A | 12/2009 |
| JP | 2010-231533 A | 10/2010 |

OTHER PUBLICATIONS

International Search Report; PCT/JP2012/073147; Oct. 30, 2012.

* cited by examiner

*Primary Examiner* — Renee Luebke
*Assistant Examiner* — Anthony R. Jimenez
(74) *Attorney, Agent, or Firm* — Studebaker & Brackett PC

(57) ABSTRACT

Provided is a touch panel that has excellent visibility without being dependent on positional accuracy of bonding between substrates on which electrodes are formed, and without being affected by the substrates. A touch panel 100 includes a first planar body 1 including, on one surface of a first substrate 11, a plurality of first electrodes 12*a* mutually extending in a substantially identical direction, and a second planar body 2 including, on one surface of a second substrate 21, a plurality of second electrodes 22*a* mutually extending in a substantially identical direction which is different from the direction in which the first electrodes 12*a* extend, the first planar body and the second planar body being arranged in a vertical direction, wherein each of the first electrodes 12*a* and each of the second electrodes 22*a* are bent-line-shaped electrode wires having a plurality of bend points.

13 Claims, 10 Drawing Sheets

(a)

(b)

(c)

(a)

(b)

TOUCH PANEL

TECHNICAL FIELD

The present invention relates to a touch panel.

BACKGROUND ART

Conventionally, a touch panel has been used in a display device of a bank terminal (cash dispenser), a ticket machine, a personal computer, an OA device, an electronic notebook, a PDA, a portable telephone, and the like. The touch panel is a sensor that detects which part has been touched, without interfering with a screen display. As a representative touch panel, an electrostatic-capacitance-type touch panel is known. The electrostatic-capacitance-type touch panel detects a position of a finger tip by obtaining a change of electrostatic capacitance between a finger tip of a person and an electrode. For example, a touch panel as disclosed in Patent Document 1 is known.

The touch panel disclosed in Patent Document 1 is configured by bonding two planar bodies 105 and 106 that have electrodes 103 and 104 having a predetermined pattern shape respectively formed on one surface of substrates 101 and 102, as shown in FIG. 12. The pattern shape of the electrodes 103 and 104 has a structure in which a plurality of rhombic-shaped electrode parts 103a and 104a are coupled in a straight-line shape. The touch panel is structured such that a coupling direction of the rhombic-shaped electrode part 103a formed on one substrate 101 and a coupling direction of the rhombic-shaped electrode part 104a formed on the other substrate 102 are orthogonal with each other, and also the upper and lower rhombic-shaped electrode parts are not overlapped in planar view. Each rhombic-shaped electrode part is formed by having a plurality of metal fine wires arranged in a lattice shape.

As shown in FIG. 13, the touch panel configured in this manner has a plurality of uniform lattice patterns formed by a plurality of metal fine wires distributed in an entire touch surface region in planar view. Therefore, local occurrence of visibility failure of the touch panel can be prevented.

PRIOR ART DOCUMENT

Patent Document

Patent Document 1: JP 2011-134311 A

SUMMARY OF THE INVENTION

Problems to be Solved by the Invention

However, in the case of the above touch panel, there has been a problem in that at the time of overlapping the two planar bodies on which the electrodes having the predetermine pattern shape are formed, a positional deviation between the electrodes occurs. That is, as indicated by arrows in FIG. 14, regions where fine lattices are densely distributed and regions where a lattice is not formed occur. As a result, uniformity of the lattice pattern is lost and the visibility of the touch panel is deteriorated. Further, when a touch panel with such a positional deviation is arranged on a display device of a ticket machine, a personal computer, and the like, shading attributable to a rough and fine structure of electrodes occurs in regions where fine lattices are densely distributed. To prevent the occurrence of such a situation, positional accuracy (bonding accuracy) at the time of bonding the two planar bodies together may be increased. However, since a line width of the metal fine wire that constitutes the electrode is small (15 μm, for example), it is actually difficult to bond the two planar bodies together so as not to generate a positional deviation.

In the case of forming the electrodes on the substrate by a printing technique such as a screen printing, for example, the substrates contract at the time of drying process after the printing. Degrees of contraction of the substrates at the time of drying change depending on various factors such as a material of the substrates, temperature and humidity, a thickness and a width of the metal fine wire that constitutes the electrodes, and lengths in a longitudinal direction and a lateral direction of the electrodes. Therefore, control of the contraction is extremely difficult. Further, longitudinal directions of the electrodes formed on the planar bodies to be bonded together are configured to be orthogonal. Therefore, regions which are remarkably affected by the contraction of the substrate differ in each of the electrodes respectively formed on one planar body and the other planar body. Consequently, even if both planar bodies are bonded with extremely high positional accuracy, it is difficult to have uniform lattice patterns to be distributed on the entire touch surface region such that the electrodes (rhombic-shaped electrode parts) formed on each planar body to be bonded do not overlap each other in planar view. That is, even if a touch panel is manufactured by bonding the two planar bodies together with high positional accuracy, a deviation of lattice patterns as shown in FIG. 14 occurs, and regions where fine lattices are densely distributed and regions where a lattice is not formed occur as indicated by the arrows. As a result, visibility failure of the touch panel occurs.

Particularly, in the case of manufacturing a large touch panel, a contraction volume of the substrate becomes large. Therefore, a degree of positional deviation between the electrodes formed on one substrate and the electrodes formed on the other substrate becomes large, and the visibility of the touch panel is greatly lost.

The present invention has been made to solve the above problems, and an object thereof is to provide a touch panel that has excellent visibility, without depending on positional accuracy of bonding of substrates on which electrodes are formed, and further, without being affected by contraction of the substrates.

Means for Solving the Problems

The object of the present invention is achieved by a touch panel including a first planar body including, on one surface of a first substrate, a plurality of first electrodes mutually extending in a substantially identical direction; and a second planar body including, on one surface of a second substrate, a plurality of second electrodes mutually extending in a substantially identical direction which is different from the direction in which the first electrodes extend, the first planar body and the second planar body being arranged in a vertical direction, wherein each of the first electrodes and each of the second electrodes are bent-line-shaped electrode wires having a plurality of bend points.

The touch panel having such a configuration can be configured so that pattern shapes of a plurality of first electrodes provided in the first planar body and pattern shapes of a plurality of second electrodes provided in the second planar body have mutually different shapes, and that lattice patterns formed on a touch surface when the plurality of first electrodes and the plurality of second electrodes are overlapped with each other are arranged such that lattices of various sizes and shapes are substantially uniformly dispersed in the entire touch surface region. In this manner, at the time of forming one electrodes (the first electrodes, for example) on a substrate, forming positions of the other electrodes (the second electrodes, for example) to be formed on the other substrate do not need to be considered. The other electrodes (the second electrodes, for example) can be formed independently of forming positions of the one electrodes (the first electrodes, for example). Therefore, the first planar body and the second planar body do not need to be overlapped with high bonding accuracy. That is, it becomes possible to alleviate accuracy of bonding between the first electrodes and the second electrodes, and the touch panel can be manufactured easily. Further, lattice patterns formed by overlapping a plurality of first electrodes and a plurality of second electrode groups are arranged such that lattices of various sizes and shapes are substantially uniformly dispersed in the entire touch surface region. Therefore, regions where fine lattices are locally densely distributed and regions where a lattice is not formed do not occur. From a macro viewpoint, the touch surface is visually recognized such that substantially uniform lattice patterns are distributed on the entire touch surface region.

In the case of forming the first electrodes and the second electrodes on the substrates (the first substrate and the second substrate) by the screen-printing method, a problem in which the first substrate and the second substrate contract may occur. However, even if such contraction of the substrates occurs, in the touch panel according to the present invention, lattice patterns formed by the first electrodes and the second electrodes are arranged such that lattices of various sizes and shapes are substantially uniformly dispersed in the entire touch surface region. Therefore even if sizes and shapes of lattices dispersively arranged are different from sizes and shapes assumed at the time of design due to the contraction of the substrates, such differences do not adversely affect the visibility of the touch panel. That is, even if contraction of each substrate occurs, satisfactory visibility can be maintained.

In the touch panel, preferably, the first electrode and the second electrode are respectively bent-line-shaped electrode wires having an identical cycle and an identical amplitude. With such a configuration, as to lattice patterns of electrodes formed by overlapping a plurality of first electrodes and a plurality of second electrodes, lattices to be distributed in the entire touch surface region can be set substantially in the same shapes and sizes. Therefore, visibility of the touch panel can be made satisfactory.

When an interior angle of an arbitrary bend point of the first electrode in a bent-line shape is θ1 and an interior angle of an arbitrary bend point of the second electrode in a bent-line shape is θ2, preferably, a relationship of the following formula is satisfied:

$$\theta1-(180°-\theta2)>10°$$ [Formula]

By setting θ1 and θ2 to satisfy a relational expression of the above formula, an arbitrary part of an electrode wire constituting the first electrode and an arbitrary part of an electrode wire constituting the second electrode intersect at a predetermined angle without exception. Therefore, in the entire touch surface region of the touch panel, the touch panel can be configured so that predetermined lattice patterns are substantially uniformly distributed, and local occurrence of regions where lattice patterns are densely distributed can be more effectively prevented.

Preferably, each of the first electrode and the second electrode has an interior angle of a bend point equal to or larger than 90°. In the case of configuring the electrodes by electrode wires in which an interior angle of a bend point is equal to or larger than 90°, the number of intersections between the first electrodes and the second electrodes becomes smaller, and visibility of the touch panel becomes more satisfactory.

Preferably, pattern shapes of the plurality of first electrodes and second electrodes are repetition patterns, the pattern shapes each having a single electrode wire width and a single electrode wire pitch. With such a configuration, as to lattice patterns of electrodes formed by overlapping a plurality of first electrodes and a plurality of second electrodes, shapes and sizes of the lattices distributed in the entire touch surface region can be set more close to the same level. Therefore, visibility of the touch panel can be made more satisfactory.

Preferably, a bundle of predetermined number of the adjacent first electrodes is configured as a first bundle-shaped detection electrode, and a bundle of predetermined number of the adjacent second electrodes is configured as a second bundle-shaped detection electrode. In this case, preferably, both end parts of the first bundle-shaped detection electrode or both end parts of the second bundle-shaped detection electrode are formed with bundling parts that bundles the plurality of first electrodes constituting the first bundle-shaped detection electrode or the plurality of second electrodes constituting the second bundle-shaped detection electrode. Further, preferably, the touch panel includes a first bridge part that connects mutually adjacent first electrodes constituting the first bundle-shaped detection electrode, and a second bridge part that connects mutually adjacent second electrodes constituting the second bundle-shaped detection electrode.

Effects of the Invention

According to the present invention, it is possible to provide a touch panel that has excellent visibility, without depending on positional accuracy of bonding of substrates on which electrodes are formed, and further, without being affected by contraction of the substrates.

EMBODIMENT OF THE INVENTION

Hereinafter, an embodiment of the present invention will be described with reference to the accompanying drawings. For easy understanding of the configuration, each of the drawings is not shown in an actual size ratio but is partially enlarged or reduced.

Figure 1:
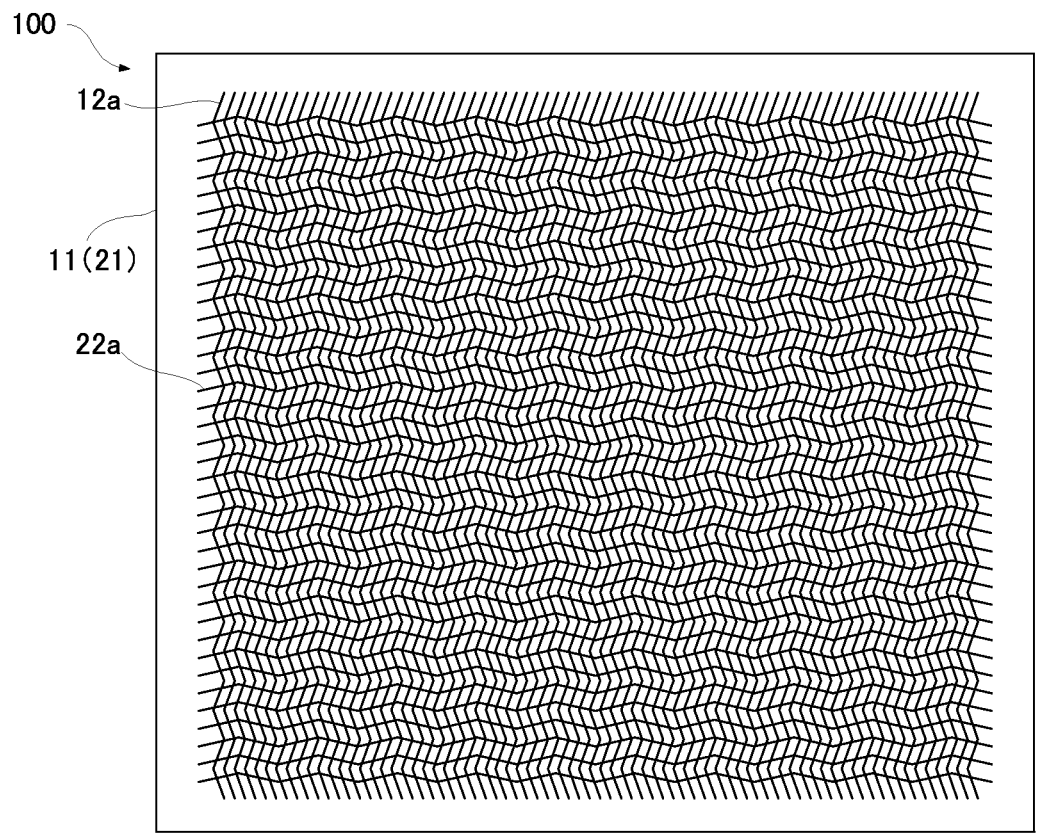
FIG. 1 is a schematic configuration plan view of a touch panel according to an embodiment of present invention.
Figure 2:
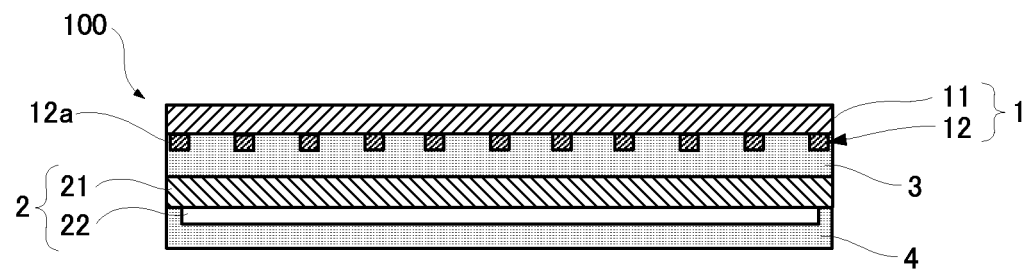
FIG. 2 is a main-part enlarged cross-sectional view of the touch panel shown in FIG. 1.
Figure 3:
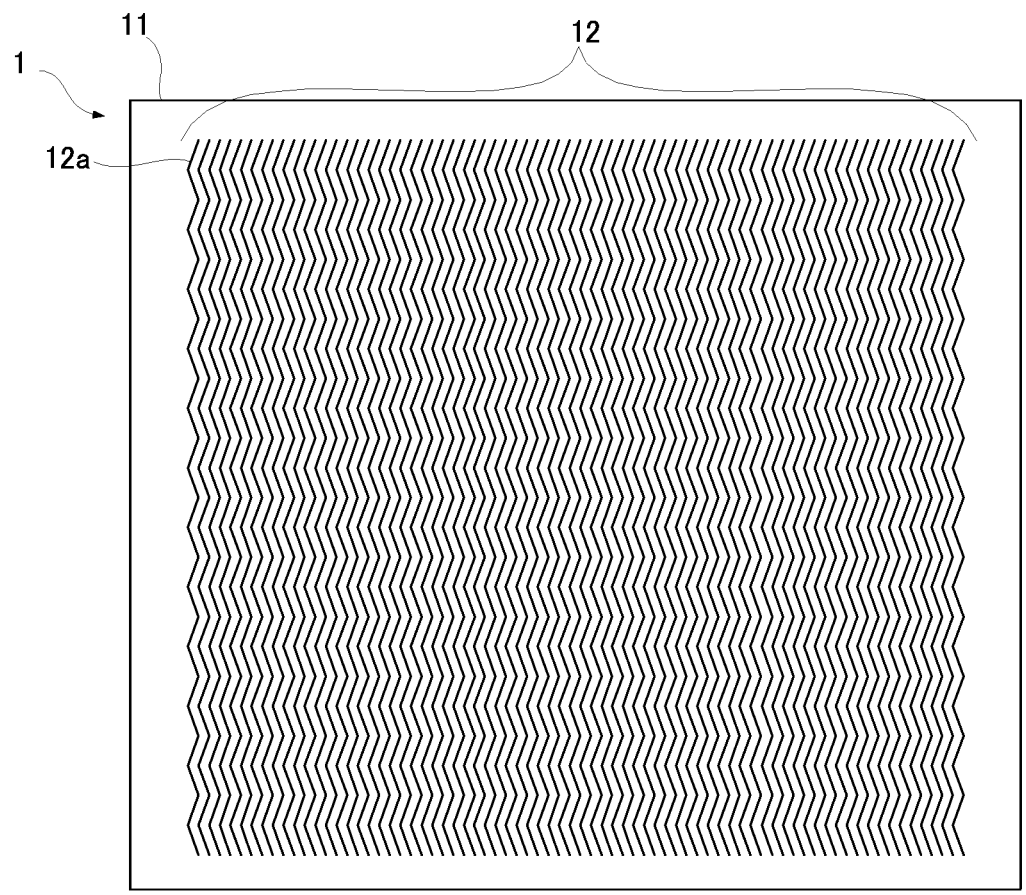
FIG. 3 is a schematic configuration plan view of a first planar body of the touch panel shown in FIG. 1.
Figure 4:
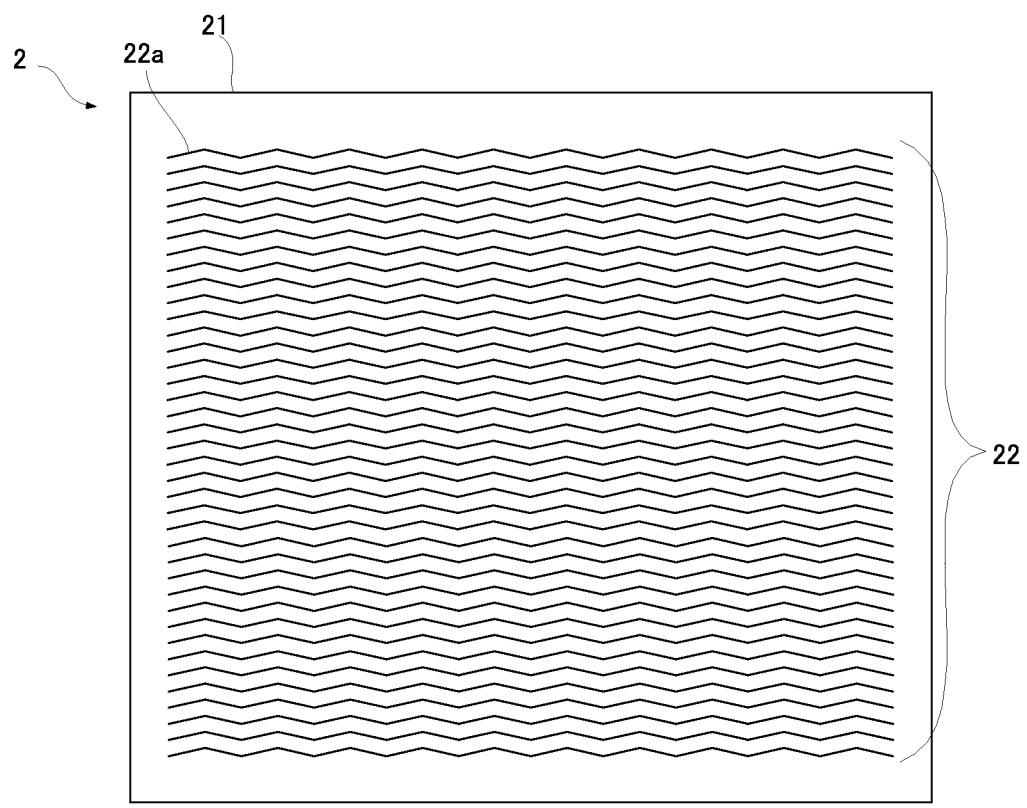
FIG. 4 is a schematic configuration plan view of a second planar body provided in the touch panel shown in FIG. 1.

FIG. 1 is a schematic configuration plan view of a touch panel according to the embodiment of the present invention, and FIG. 2 is a main-part enlarged cross-sectional view thereof. A touch panel 100 is an electrostatic-capacitance-type touch panel, and includes a first planar body 1 and a second planar body 2 as shown in FIG. 2. The first planar body 1 and the second planar body 2 are arranged in a vertical direction. As shown in FIG. 2 and FIG. 3, the first planar body 1 includes a first substrate 11, and a first electrode group 12 formed on one surface of the first substrate 11. The first electrode group 12 is formed as a group of predetermined-shaped first electrodes 12a mutually extending in a substantially identical direction. As shown in FIG. 2 and FIG. 4, the second planar body 2 also includes a second substrate 21, and a second electrode group 22 formed on one surface of the second substrate 21 similarly to the first planar body 1. The second electrode group 22 is formed as a group of predetermined-shaped second electrodes 22a mutually extending in a substantially identical direction which is different from the direction in which the first electrodes 12a extend. As shown in FIG. 2, the first planar body 1 and the second planar body 2 are bonded to each other with an adhesive layer 3 interposed therebetween so that the first electrode group 12 and the other surface side of the second substrate 21 (a side of a surface on which the second electrode group 22 is not formed) are opposite to each other with a distance. Note that the first planar body 1 and the second planar body 2 may be bonded with the adhesive layer 3 interposed therebetween so that the first electrode group 12 and the second electrode group 22 are opposite to each other with a distance.

The touch panel 100 having such a configuration is used by being attached to a display device of a bank terminal (cash dispenser), a ticket machine, a personal computer, an OA device, an electronic notebook, a PDA, and a portable telephone. In attaching the touch panel 100, the touch panel 100 is attached to the display device with a transparent adhesive layer interposed therebetween 4 so that the other surface side (a side of a surface on which the first electrodes 12a are not formed) of the substrate of the first planar body 1 becomes an exposed surface (touch surface). By bonding a surface protection layer such as cover glass to the second planar body 2 with the adhesive layer 4 interposed therebetween, the first substrate 11 may be attached to the display device with an adhesive layer (not shown) interposed therebetween so that an exposed surface of the surface protection layer becomes a touch surface.

The first substrate 11 and the second substrate 21 are dielectric substrates constituting insulation layers, and it is preferable that the substrates are made of a material of high transparency. For example, the first substrate 11 and the second substrate 21 are formed of a flexible film made of a synthetic resin such as polyethylene terephthalate (PET), polyimide (PI), polyethylene naphthalate (PEN), polyether-sulfone (PES), polyether ether ketone (PEEK), polycarbonate (PC), polystyrene (PS), polyamide (PA), acrylic, an amorphous polyolefin resin, a cyclic polyolefin resin, aliphatic alicyclic polyolefin, and a norbornene thermoplastic transparent resin, a laminate of two or more kinds of these materials, or a glass plate such as soda glass, non-alkali glass, borosilicate glass, and quartz glass. Thicknesses of the first substrate 11 and the second substrate 21 are not particularly limited. However, for example, in the case of forming the first substrate 11 and the second substrate 21 by a flexible film made of a synthetic resin, the thicknesses are preferably about 10 µm to 2000 µm, and more preferably about 50 µm to 500 µm. In addition, in the case of forming the first substrate 11 and the second substrate 21 by a glass plate, thicknesses are preferably about 0.1 mm to 5 mm.

In the case of forming the first substrate 11 and the second substrate 21 by a material having flexibility, a supporting body may be bonded to the first substrate 11 and the second substrate 21 to provide rigidity. For the supporting body, a glass plate and a resin material having hardness similar to that of glass can be exemplified, and the thickness of the material is preferably equal to or larger than 100 µm, and more preferably 0.2 mm to 10 mm.

Figure 5:
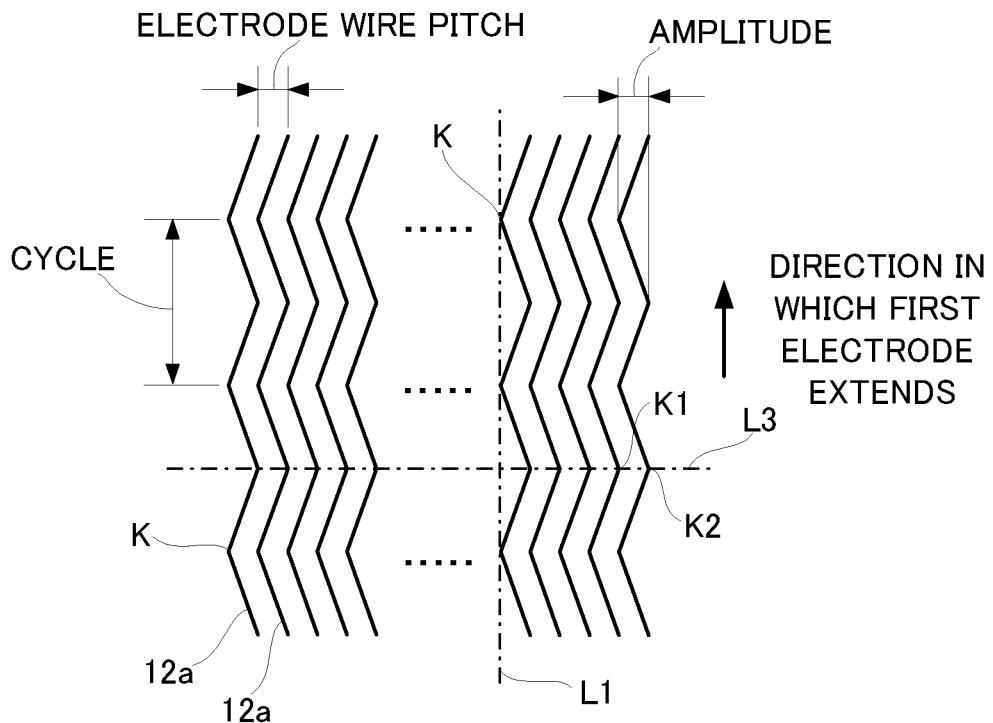
FIG. 5 is a main-part enlarged view of FIG. 3.
Figure 6:
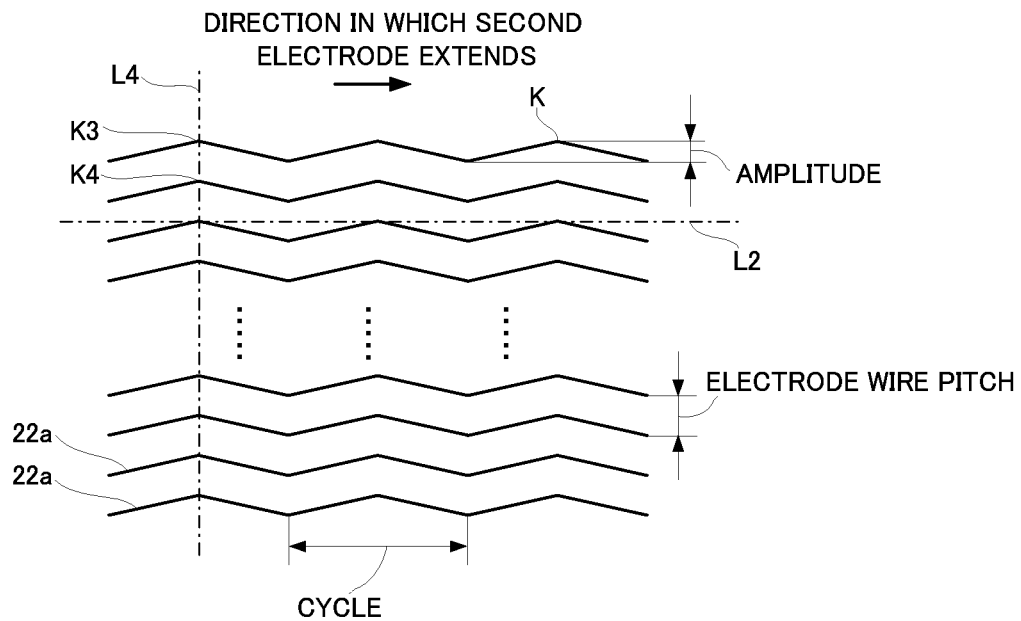
FIG. 6 is a main-part enlarged view of FIG. 4.

As shown in FIG. 3 and FIG. 5 which is a main-part enlarged view of FIG. 3, each of the first electrodes 12a constituting the first electrode group 12 is configured as a bent-line-shaped electrode wire (zig-zag electrode wire that is repeatedly bent at a predetermined angle) having a plurality of bend points K. Similarly, as shown in FIG. 4 and FIG. 6 which is a main-part enlarged view of FIG. 4, each of the second electrodes 22a constituting the second electrode group 22 is configured as a bent-line-shaped electrode wire (zig-zag electrode wire that is repeatedly bent at a predetermined angle) having a plurality of bend points K. Electrode wires constituting the first electrode 12a and the second electrode 22a are formed by metal fine wires. A bent-line-shaped electrode wire constituting the first electrode 12a is a bent-line-shaped electrode wire having an identical cycle and an identical amplitude. A plurality of such electrode wires are arranged in parallel as repetition patterns each having a single electrode wire width and a single electrode wire pitch. Similarly, a bent-line-shaped electrode wire constituting each of the second electrodes 22a is a bent-line-shaped electrode wire having an identical cycle and an identical amplitude. A plurality of such electrode wires are arranged in parallel as repetition patterns each having a single electrode wire width and a single electrode wire pitch. In the present embodiment, each of the first electrodes 12a constituting the first electrode group 12 is configured to have the same shape. Further, each of the second electrodes 22a constituting the second electrode group 22 is configured to have the same shape. Specifically, the shape of the first electrode 12a adjacent to a certain first electrode 12a has a shape in which the certain first electrode 12a is shifted by a predetermined pitch in a direction orthogonal to a direction in which the first electrode 12a extends. The same applies to the second electrode 22a. Because the first electrode 12a and the second electrode 22a are configured as above, a line segment L1 that connects the bend points K of every other first electrode 12a and a line segment L2 that connects the bend points K of every other second electrode 22a are orthogonal to each other. That is, a direction in which the first electrodes 12a are adjacent and a direction in which the second electrodes 22a are adjacent are orthogonal to each other. Further, a line segment L3 is parallel to the line segment L2 that connects line segments K of every other second electrode 22a. The line segment L3 connects an arbitrary bend point K1 of an arbitrary first electrode 12a and a bend point K2 which is a bend point K of other first electrode 12a adjacent to the arbitrary first electrode 12a and arranged adjacent to the bend point K1. Similarly, a line segment L4 is parallel to the line segment L1 that connects line segments K of every other first electrode 12a. The line segment L4 connects an arbitrary bend point K3 of an arbitrary second electrode 22a and a bend point K4 which is a bend point K of other second electrode 22a adjacent to the arbitrary second electrode 22a and arranged adjacent to the bend point K3.

Although depending on a configuration condition of a color filter provided in a display device such as a monitor in which the touch panel 100 according to the present embodiment is installed, it is preferable that a width of the bent-line-shaped electrode wire constituting the first electrode 12a and the second electrode 22a is within a range of 1 μm to 100 μm, for example. Further, preferably, the electrodes are configured so that a cycle of each bent-line-shaped electrode wire is within a range of 2.0 mm to 10 mm and an amplitude of each bent-line-shaped electrode wire is within a range of 0.5 mm to 5.0 mm. Preferably, the electrodes are configured so that electrode wire pitches of the first electrode 12a and the second electrode 22a is within a range of 0.2 mm to 2.0 mm.

Figure 7:
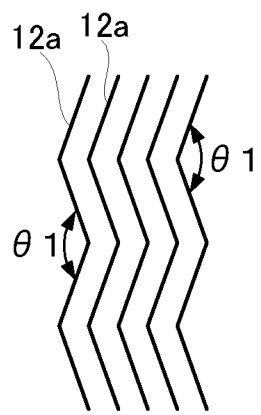
FIG. 7(a) is a main-part enlarged plan view showing a first electrode.
FIG. 7(b) is a main-part enlarged plan view showing a second electrode.
FIG. 7(c) is a main-part enlarged plan view showing a state where a part of electrode wires constituting the first electrode and a part of electrode wires constituting the second electrode are arranged at positions where the parts are close to each other and are parallel to each other.
Figure 7:
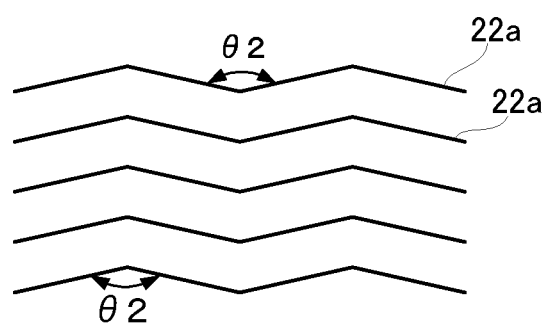
Figure 7:
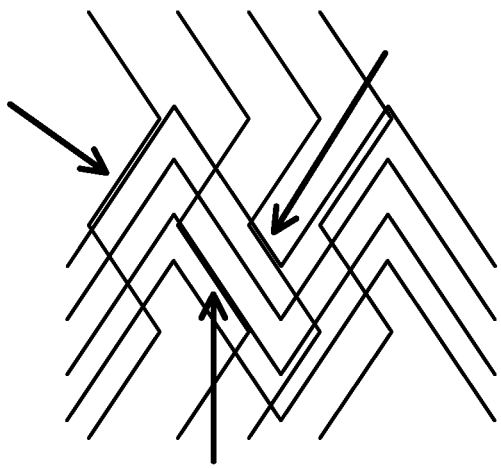

From the viewpoint of preventing the occurrence of a moire by improving visibility of the touch panel 100, as shown in FIGS. 7(a) and 7(b), it is preferable to configure the touch panel 100 such that the relationship of the following Formula 1 is satisfied, where an interior angle of an arbitrary bend point K of the bent-line-shaped first electrode 12a is $\theta 1$, and an interior angle of an arbitrary bend point K of the bent-line-shaped second electrode 22a is $\theta 2$.

$$\theta 1 - (180° - \theta 2) \neq 0°$$ [Formula 1]

By setting the interior angle $\theta 1$ of the arbitrary bend point K of the first electrode 12a and the interior angle $\theta 2$ of the arbitrary bend point K of the second electrode 22a in this manner, at the time of bonding the first planar body 1 and the second planar body 2, it is possible to prevent a part of the electrode wire constituting the first electrode 12a and a part of the electrode wire constituting the second electrode 22a from being arranged at positions where the parts are close to each other and parallel to each other, as shown by arrows in FIG. 7(c).

More preferably, it is preferable to configure the touch panel 100 such that $\theta 1$ and $\theta 2$ satisfy the relationship of the following Formula 2:

$$(\theta 1 - (180° - \theta 2)) > 10°$$ [Formula 2]

By setting $\theta 1$ and $\theta 2$ in this manner, an arbitrary part of the electrode wire constituting the first electrode 12a and an arbitrary part of the electrode wire constituting the second electrode 22a intersect at a predetermined angle without exception. Therefore, in the entire touch surface of the touch panel 100, the touch panel 100 can be configured such that predetermined lattice patterns are substantially uniformly distributed, and local occurrence of a region in which lattices forming lattice patterns are densely distributed can be more effectively prevented. When $\theta 1$ and $\theta 2$ are set so that a value of the left side of Formula 2 becomes equal to or larger than 15°, this effect becomes more prominent and is more preferable. Herein, the lattice pattern is a concept that includes not only a set of patterns formed by square lattices but also a set of patterns formed by polygons such as a triangle, a pentagon, and a hexagon. Further, the lattice pattern is a concept that also includes a set of patterns formed by various polygonal-shaped lattices (lattices having a triangle, a pentagon, and a hexagon shape, for example).

The first electrode group 12 and the second electrode group 22 respectively formed on the first substrate 11 and the second substrate 21 are formed by the screen-printing method. Specifically, by using a screen printing plate that has predetermined-shaped opening parts corresponding to pattern shapes of the first electrode group 12 and the second electrode group 22, conductive ink for the first electrode 12a and the second electrode 22a is pushed out through the opening parts by a squeegee. Consequently, the first electrode group 12 and the second electrode group 22 are respectively formed on the first substrate 11 and the second substrate 21. In addition to the screen-printing method, the first electrode group 12 and the second electrode group 22 may be respectively formed on the first substrate 11 and the second substrate 21 by using various printing methods such as an ink-jet method, gravure printing, and offset printing. Instead of using the screen-printing method, the first electrode group 12 and the second electrode group 22 may be respectively formed on the first substrate 11 and the second substrate 21 by using photolithography.

The conductive ink is a fluid in which conductive fine particles are uniformly dispersed without aggregation in a solvent including a resin component and a solution. An example of conductive fine particles contained in a fluid may include fine particles having silver as a main component. The fine particles may contain, as a main component, any one of gold, silver, copper, an alloy of gold and silver, an alloy of gold and copper, an alloy of silver and copper, and an alloy of gold, silver, and copper. For other conductive ink, there can be used a conductive material that uses, as a conductor, a conductive high polymer such as PEDOT (poly-3,4-ethylene dioxythiophene), and a ultra fine conductive fiber such as carbon nanowire and metal nanowire are used as a conductor.

For the conductive ink, a solution or a dispersion liquid of organic carboxylic acid silversalt can be used, for example. In this case, after coating the conductive ink on the substrate, metal silver is generated on the first substrate 11 and the second substrate 21 by heating, so that the first electrode 12a and the second electrode 22a are formed. Specifically, a plurality of predetermined-shaped electrode wires are formed in parallel, and thereafter, the electrode wires are heated to 60° C. to 200° C., to form metal silver on the substrates 11 and 21. The heating for generating metal silver from organic carboxylic acid silversalt can be performed by a method such as a heating method using an electric furnace, and a heating method using a heating head of a thermosensitive method.

Organic carboxylic acid silversalt that forms the first electrode 12a and the second electrode 22a is a reducible silver source, and it is preferable that the silver source is organic carboxylic acid silversalt, particularly silver salt of aliphatic carboxylic acid of a long chain (carbon number 10 to 30, preferably, 15 to 25). Preferable examples of silversalt may include silversalt of gallic acid, oxalic acid, behenic acid, stearic acid, arachic acid, palmitic acid, and lauric acid, and silversalt of aromatic carboxylic acid such as salicylic acid, benzoic acid, and 3,5-dihydroxybenzoic acid, for example. As preferable organic carboxylic acid silversalt, silver isobutyrylacetate, silver benzoylacetate, and silver acetoacetate can be exemplified.

As methods of preparing organic carboxylic acid silversalt, there can be exemplified a method of gradually or rapidly adding an aqueous silver nitrate solution to a reaction vessel that contains an organic carboxylic acid alkali metal salt solution or a suspension, a method of gradually or rapidly adding an organic carboxylic acidalkali metal salt solution or a suspension prepared in advance in a reaction vessel that contains an aqueous silver nitrate solution, and a method of simultaneously adding, into a reaction vessel, an aqueous silver nitrate solution and an organic carboxylic acid alkali metal salt solution or a suspension prepared in advance.

One end part of each first electrode 12a and each second electrode 22a is electrically connected to an external circuit (not shown) for driving a touch panel arranged outside, via a wiring conductor (laying wiring) formed on the substrates 11 and 21. The wiring conductor may be configured to be connected to each first electrode 12a and each second electrode 22a, and an input signal from each first electrode 12a (each second electrode 22a) may be detected. Alternatively, a plurality (8 to 12, for example) of adjacent first electrodes 12a (second electrodes 22a) may be set as one bundle, and the wiring conductor may be connected to each bundle. As described above, when a bundle of a plurality of adjacent first electrodes 12a (second electrode 22a) is used as one detection electrode, a resistance value of the detection electrode can be set low, and position detection sensitivity of the touch panel can be improved. Methods of forming a wiring conductor include (A) a method of screen printing a conductive paste containing ultra fine conductive particles on a substrate (see JP 2007-142334 A, etc.) and (B) a method of laminating a metal foil such as copper on a substrate, forming a resist pattern on the metal foil, and etching the metal foil (see JP 2008-32884 A, etc.).

The conductive particles used in the forming method (A) may include fine particles containing silver as a main component. For example, the fine particles may contain, as a main component, any one of gold, silver, copper, an alloy of gold and silver, an alloy of gold and copper, an alloy of silver and copper, and an alloy of gold, silver, and copper. Further, the conductive particles may be fine particles containing, as a main component, indium tin oxide (ITO), conductive oxide (IZO [indium zinc oxide]) having zinc oxide mixed with indium oxide, or conductive oxide (ITSO) having silicon oxide mixed with indium oxide. For other conductive paste, there can be used a conductive material that uses, as a conductor, conductive high polymer such as PEDOT (poly-3,4-ethylene dioxythiophene), and a ultra fine conductive fiber such as a carbon nanowire and a metal nanowire. A method of forming a wiring conductor is not limited to the forming methods (A) and (B), and a printing method such as gravure printing other than (A) and photolithography other than (B) may also be used.

For the adhesive layer 3 or 4, a general transparent adhesive such as an epoxy-based adhesive and an acrylic-based adhesive can be used, and the adhesive layer may include a core material made of a transparent film of norbornene-based resin. The adhesive layer 3 may be formed by overlapping a plurality of sheet-like adhesive materials, and further, may be formed by overlapping a plurality of types of sheet-like adhesive materials. A thickness of the adhesive layer 3 is not particularly specified, however, 200 μm or less is preferred for practical application.

In the touch panel 100 having the above configuration, a method of detecting a touch position is similar to that of a conventional electrostatic-capacitance-type touch panel 100. When an arbitrary position at a surface side of the first planar body 1 is touched by a finger or the like, the first electrode 12a and the second electrode 22a are grounded via the electrostatic capacitance of a human body at the touched position. By detecting a value of current flowing in the first electrode 12a and the second electrode 22a, coordinates of the touched position are calculated.

In the touch panel 100 according to the present invention, the first electrode group 12 and the second electrode group 22 provided in the first planar body 1 and the second planar body 2 overlapped together are configured as groups of bent-line-shaped electrode wires having a plurality of bend points K. The touch panel having such a configuration can be configured so that pattern shapes of the first electrode group 12 (the plurality of first electrodes 12a) provided in the first planar body 1 and pattern shapes of the second electrode group 22 (the plurality of second electrodes 22a) provided in the second planar body 2 are formed to have mutually independent shapes, and that lattice patterns formed on a touch surface when the first electrode group 12 and the second electrode group 22 are overlapped with each other are arranged such that lattices of various sizes and shapes are substantially uniformly dispersed in the entire touch surface region. In this manner, at the time of forming one electrodes (the first electrodes 12a, for example) on a substrate, forming positions of the other electrodes (the second electrodes 22a, for example) to be formed on the other substrate do not need to be considered. The other electrodes (the second electrodes 22a, for example) can be formed independently of forming positions of the one electrodes (the first electrodes 12a, for example). Therefore, the first planar body 1 and the second planar body 2 do not need to be overlapped with high bonding accuracy. That is, it becomes possible to alleviate bonding accuracy of bonding between the first electrodes 12a and the second electrodes 22a, and the touch panel 100 can be manufactured easily. Further, lattice patterns formed by overlapping the first electrode group 12 and the second electrode group 22 are arranged so that lattices of various sizes and shapes are substantially uniformly dispersed in the entire touch surface region. Therefore, regions where fine lattices are locally densely distributed and regions where a lattice is not formed do not occur. From a macro viewpoint, the touch surface is visually recognized such that the substantially uniform lattice patterns are distributed on the entire touch surface region.

In the case of sintering after forming the first electrodes 12a and the second electrodes 22a on the substrates (the first substrate 11 and the second substrate 21), a problem in which the first substrate 11 and the second substrate 21 contract may occur. However, even if such contraction of the substrates (the first substrate 11 and the second substrate 21) occurs, in the touch panel 100 according to the present invention, lattice patterns formed by the first electrodes 12a and the second electrodes 22a are arranged such that lattices of various sizes and shapes are substantially uniformly dispersed in the entire touch surface region. Therefore, even if sizes and shapes of lattices dispersively arranged are different from sizes and shapes assumed at the time of design due to the contraction of the substrates (the first substrate 11 and the second substrate 21), such differences do not adversely affect the visibility of the touch panel 100. That is, even if contraction of the substrates (the first substrate 11 and the second substrate 21) occurs, satisfactory visibility can be maintained. That is, since the contraction of the substrates (the first substrate 11 and the second substrate 21) does not affect the visibility in the touch panel 100, contraction of the substrates 11 and 21 does not need to be considered at the time of forming the electrodes 12a and 22a on the substrates 11 and 21 by a printing method such as the screen-printing method. Thus, manufacturing of the first planar body 1 and the second planar body 2 becomes easy.

When the touch panel 100 is arranged on the display device of a ticket machine, a personal computer, and the like, occurrence of a moire is also assumed depending on a configuration condition (a size of a black matrix, a size of an RGB pattern, a layout direction, etc.) of a color filter that is provided in the display device. However, the occurrence of the moire can be suppressed by a simple method of adjusting (changing) an interior angle, a pitch, and the like of each bend point K of the first electrodes 12a and the second electrodes 22a.

In the touch panel 100 according to the present invention, the first electrodes 12a and the second electrodes 22a are configured respectively by bent-line-shaped electrode wires having the identical cycle and the identical amplitude. Therefore, as to lattice patterns of the electrodes formed by overlapping the plurality of first electrodes 12a and the plurality of second electrodes 22a, lattices distributed in the entire touch surface region can be set substantially in the same shapes and sizes. Consequently, visibility of the touch panel 100 can be made satisfactory.

The pattern shapes of the plurality of first electrodes 12a and second electrodes 22a are formed respectively by repetition patterns, each having a single electrode wire width and a single electrode wire pitch. Therefore, shapes and sizes of the lattices distributed in the entire touch surface region can be set more close to the same level (uniform). Therefore, visibility of the touch panel 100 can be made more satisfactory.

An electrode wire pitch of each first electrode 12a constituting the first electrode group 12 and an electrode wire pitch of each second electrode 22a constituting the second electrode group 22 may be different from each other. When the touch panel has such a configuration, in the lattice patterns formed by the plurality of first electrodes 12a and the plurality of second electrodes 22a, it is possible to more effectively suppress occurrence of regions where fine lattices are locally densely distributed. Therefore, visibility of the touch panel 100 can be made satisfactory.

The present inventors prepared samples A to F of the first planar body 1 and the second planar body 2 that configure the touch panel 100 according to the present invention, and performed a sensory test concerning visibility when two samples are arranged in an overlapped state on a monitor. Test content and results are described below.

The test content is such that two samples each of samples A to F described below are prepared, and visibilities are visually determined as satisfactory or unsatisfactory when the two samples are overlappingly arranged on the monitor so that directions in which the bent-line-shaped electrode wires extend are in mutually orthogonal directions. As to combinations of the overlapping samples, all kinds of samples are combined such as the sample A and the sample A, the sample A and the sample B, and the sample A and the sample C, for example, and visibilities are determined as satisfactory or unsatisfactory.

The sample A has a plurality of bent-line-shaped electrode wires arranged at an electrode wire pitch of 0.429 mm, each bent-line-shaped electrode wire having an interior angle (corresponding to θ1 in FIG. 7(a) or θ2 in FIG. 7(b)) of 90° at each bend point K, a cycle of 2.742 mm, and an amplitude of 1.371 mm. The sample B has a plurality of bent-line-shaped electrode wires identical to the bent-line-shaped electrode wires of the sample A arranged at an electrode wire pitch of 0.527 mm. The sample C has a plurality of bent-line-shaped electrode wires identical to the bent-line-shaped electrode wires of the sample A arranged at an electrode wire pitch of 0.686 mm. The sample D has a plurality of bent-line-shaped electrode wires arranged at an electrode wire pitch of 0.429 mm, each bent-line-shaped electrode wire having an interior angle (corresponding to θ1 in FIG. 7(a) or θ2 in FIG. 7(b)) of 136° at each bend point K, a cycle of 6.856 mm, and an amplitude of 1.371 mm. The sample E has a plurality of bent-line-shaped electrode wires identical to the bent-line-shaped electrode wires of the sample D arranged at an electrode wire pitch of 0.527 mm. The sample F has a plurality of bent-line-shaped electrode wires identical to the bent-line-shaped electrode wires of the sample D arranged at an electrode wire pitch of 0.686 mm.

For comparison, an electrode wire of a sine wave shape having a predetermined cycle and a predetermined amplitude is configured. A plurality of such electrode wires are arranged on a substrate at a predetermined electrode wire pitch. Two samples each of samples a to f of the electrode wires on the substrates are prepared. Visibilities are visually determined as satisfactory or unsatisfactory when the two samples each are overlappingly arranged on the monitor so that directions in which sine-wave shaped electrode wires extend are in mutually orthogonal directions. As to combinations of the overlapping samples, all kinds of samples are combined similarly to the samples A to F. The sample a has a plurality of electrode wires of a sine wave shape arranged at an electrode wire pitch of 0.429 mm, each electrode wire having a cycle of 6.856 mm and an amplitude of 1.159 mm. The sample b has a plurality of electrode wires of a sine wave shape arranged at an electrode wire pitch of 0.527 mm, each electrode wire having the sine wave shape identical to that of the sample a. The sample c has a plurality of electrode wires of a sine wave shape arranged at an electrode wire pitch of 0.686 mm, each electrode wire having the sine wave shape identical to that of the sample a. The sample d has a plurality of electrode wires of a sine wave shape arranged at an electrode wire pitch of 0.429 mm, each electrode wire having a cycle of 6.856 mm and an amplitude of 1.489 mm. The sample e has a plurality of electrode wires of a sine wave shape arranged at an electrode wire pitch of 0.527 mm, each electrode wire having the sine wave shape identical to that of the sample d. The sample f has a plurality of electrode wires of a sine wave shape arranged at an electrode wire pitch of 0.686 mm, each electrode wire having the sine wave shape identical to that of the sample d.

When the samples a to f formed by the electrode wires of a sine wave shape are combined and arranged on the monitor, in all the combinations, a result was obtained that a moire occurs, and visibility is poor near the poles of the electrode wires of a sine wave shape. On the other hand, as to the samples A to F in which the bent-line-shaped electrode wires having a plurality of bend points K are formed, a result was obtained that a moire as confirmed in the samples a to f does not occur, and visibility is relatively satisfactory. In the case of combining the samples A, combining the samples B, and combining the samples C with each other, a result was obtained that patchy bright points occur, and visibility is slightly poor.

Particularly, in the case of combining the sample B and the sample E and in the case of combining the sample C and the sample E, events such as a color blur and emphasis of an electrode wire pattern do not occur, and it became clear that extremely satisfactory visibility is obtained. In the sample B, the sample C, and the sample E, there are formed bent-line-shaped electrode wires having interior angles at each bend point K of equal to or larger than 90°. Therefore, by forming the electrode wire so that the interior angle of the bend points K of the first electrode 12a and the second electrode 22a that configure the touch panel 100 becomes equal to or larger than 90°, it is considered possible to obtain the touch panel 100 in which a moire, a bright point, and a color blur do no easily occur and an electrode pattern is not easily emphasized. In the case of configuring the first electrodes 12a and the second electrodes 22a using the electrode wires in which an interior angle of each bend point is equal to or larger than 90°, the number of intersections between the first electrodes 12a and the second electrodes 22a becomes smaller, and visibility of the touch panel becomes further satisfactory.

Figure 8:
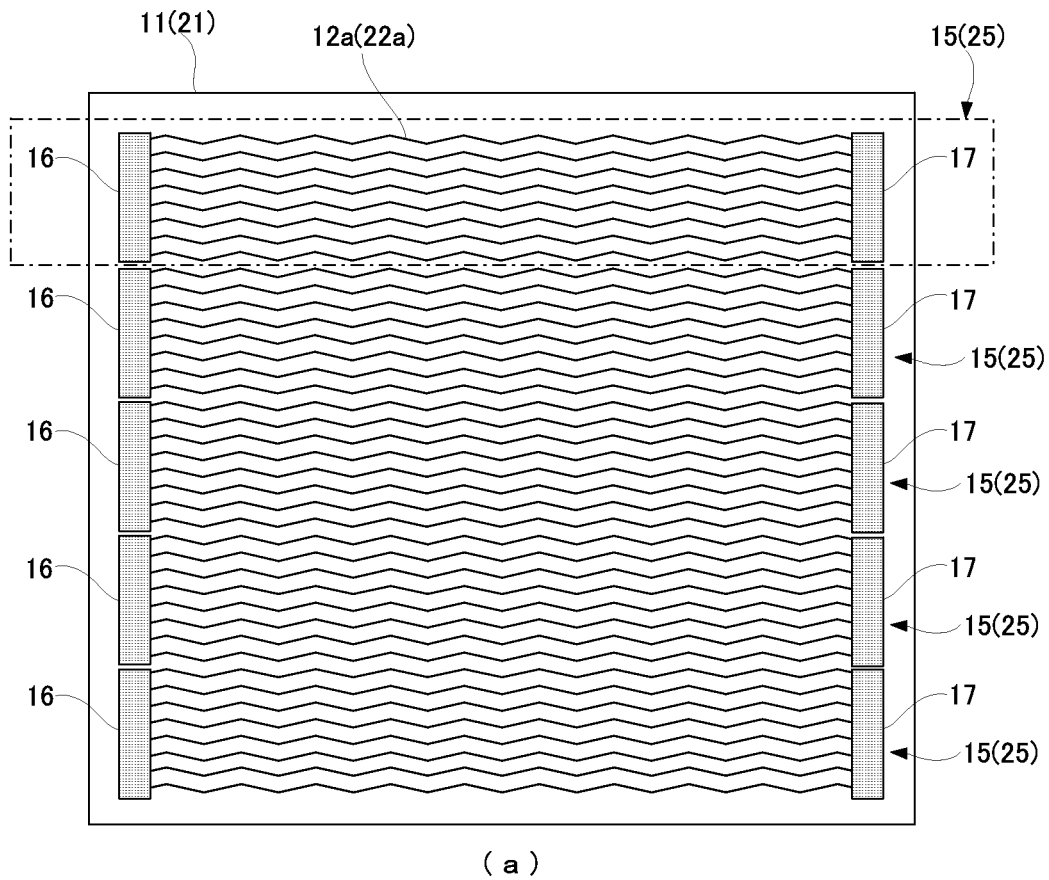
FIGS. 8(a) and 8(b) are explanatory views for explaining a modification of the touch panel shown in FIG. 1.
Figure 8:
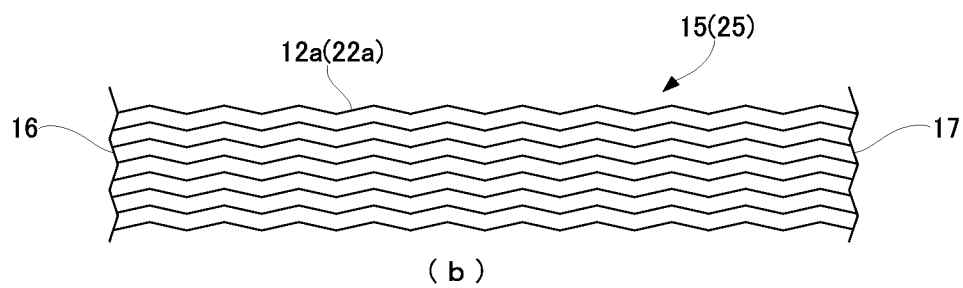

Although the touch panel 100 according to one embodiment of the present invention has been described above, a detailed configuration is not limited to the above embodiment. For example, as described above, in the case of configuring the touch panel 100 so that the detection electrodes are arranged in parallel by using a bundle of predetermined number (8 to 12, for example) of the adjacent first electrodes 12a (second electrodes 22a) as one detection electrode, the touch panel 100 may be configured as follows. For example, as shown in FIG. 8(a), in each first bundle-shaped detection electrode 15 (second bundle-shaped detection electrode 25), a first bundling part 16 that electrically connects each end part of a plurality of first electrodes 12a (second electrodes 22a) constituting the first bundle-shaped detection electrode 15 (second bundle-shaped detection electrode 25) and a second bundling part 17 that electrically connects each of the other end parts are provided, and a wiring conductor (routed wiring) is connected to the first bundling part 16. In this case, as shown in FIGS. 8(a) and 8(b), the first bundling part 16 and the second bundling part 17 are preferably provided, however, the second bundling part 17 to which the wiring conductor (routed wiring) is not connected may be omitted. When not only the first bundling part 16 but also the second bundling part 17 to which the wiring conductor (routed wiring) is not connected is provided, it becomes possible to improve position detection sensitivity of the touch panel by further lowering a total resistance value of each first bundle-shaped detection electrode 15 (second bundle-shaped detection electrode 25). Even if a part of one first electrode 12a (second electrode 22a) is disconnected, for example, a change signal of electrostatic capacitance that is input to the disconnected first electrode 12a (second electrode 22a) is transmitted to the first bundling part 16 via the second bundling part 17 and other first electrode 12a (second electrode 22a). Therefore, a touch position can be stably detected. A detection electrode that is not connected to the wiring conductor (routed wiring) may be provided between adjacent first bundle-shaped detection electrodes 15 (second bundle-shaped detection electrodes 25).

The first bundling part 16 and the second bundling part 17 can be formed by the screen-printing method, for example. Specifically, by using a screen printing plate having predetermined-shaped opening parts corresponding to shapes of the first bundling part 16 and the second bundling part 17, and pushing out conductive ink by a squeegee through the opening parts, the first bundling part 16 and the second bundling part 17 are respectively formed on the first substrate 11 and the second substrate 21. In addition to the screen-printing method, the first bundling part 16 and the second bundling part 17 may be formed by using various printing methods such as an ink-jet method, gravure printing, and offset printing. For the conductive ink, conductive ink equivalent to that used for forming the first electrode group 12 and the second electrode group 22 described above can be used. In the case of using the same conductive ink, the first bundling part 16 and the second bundling part 17 may be simultaneously formed at the time of forming the first electrode group 12 and the second electrode group 22 by printing and the like. In FIG. 8(a), although the first bundling part 16 and the second bundling part 17 are formed to have a rectangular shape in planar view, they are not particularly limited to this shape. For example, the first bundling part 16 and the second bundling part 17 may have a bent-line shape with a plurality of bend points, as shown in FIG. 8(b).

Figure 9:
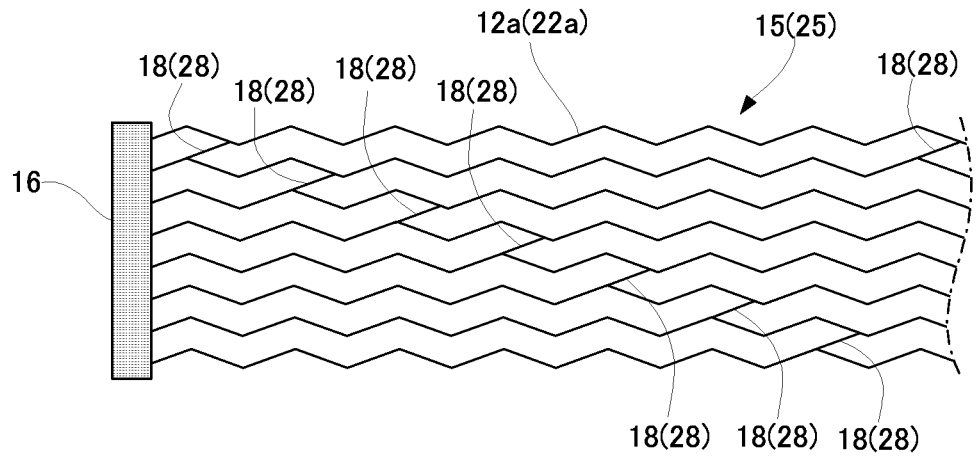
FIG. 9 is an explanatory view for explaining a modification of the touch panel shown in FIG. 1.

Moreover, in the case of configuring the touch panel 100 by using a bundle of predetermined number (8 to 12, for example) of the adjacent first electrodes 12a (second electrodes 22a) as one detection electrode, as shown in FIG. 9, a plurality of first bridge parts 18 (second bridge parts 28) that connect mutually adjacent first electrodes 12a (second electrodes 22a) may be provided in each first bundle-shaped detection electrode 15 (second bundle-shaped detection electrode 25). By providing the first bridge part 18 (second bridge part 28), even if a part of one first electrode 12a (second electrode 22a) constituting each first bundle-shaped detection electrode 15 (second bundle-shaped detection electrode 25) is disconnected, a change signal (touch signal) of electrostatic capacitance that is input to the disconnected first electrode 12a (second electrode 22a) can be transmitted to other first electrode 12a (second electrode 22a) via the first bridge part 18 (second bridge part 28) and guided to an external circuit (not shown) for driving the touch panel arranged outside. Consequently, a touch position can be stably detected.

As shown in FIG. 9, the first bridge part 18 (second bridge part 28) can be configured as a straight-line shape wiring for connecting adjacent first electrodes 12a (second electrodes 22a). In the case of forming the first bridge part 18 (second bridge part 28) as a wiring type in this manner, preferably, one end point of the first bridge part 18 (second bridge part 28) is formed as a bend point of the first electrode 12a (second electrode 22a). Further, as shown in FIG. 9, preferably, the first bridge part 18 (second bridge part 28) is formed as a line extending in the same inclination as that of the first electrode 12a (second electrode 22a) from a certain bend point. Alternatively, the first bridge part 18 (second bridge part 28) may be formed to connect a certain bend point and an adjacent bend point in a straight-line shape.

Figure 10:
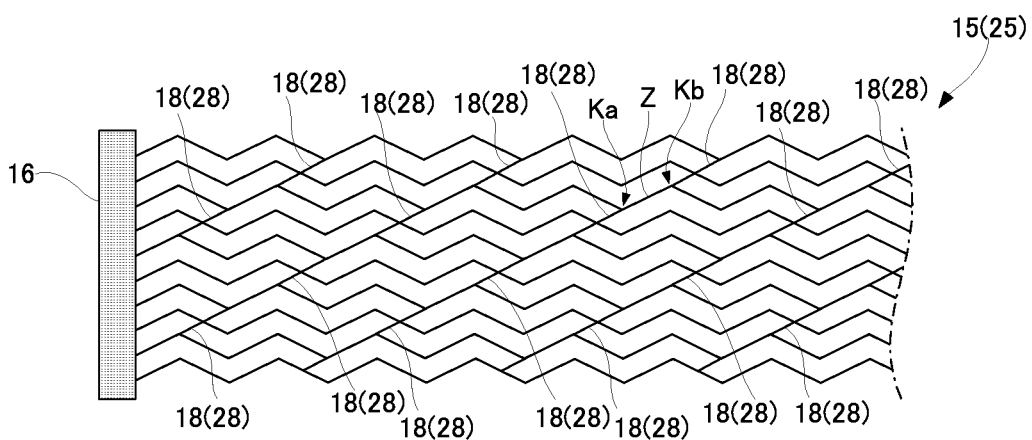
FIG. 10 is an explanatory view for explaining a modification of the touch panel shown in FIG. 1.

The first bridge part 18 (second bridge part 28) of a wiring type may be formed so that a plurality of first electrodes 12a (second electrodes 22a) that are arranged in parallel are transversely connected as shown in FIG. 10. In the case of forming the first bridge part 18 (second bridge part 28) so as to transversely and collectively connect a plurality of the first electrodes 12a (second electrodes 22a) in this manner, as shown in FIG. 10, preferably, the first bridge part 18 (second bridge part 28) is configured so that one end point of the first bridge part 18 (second bridge part 28) becomes a bend point of one first electrode 12a (second electrode 22a) and the other end point of the first bridge part 18 (second bridge part 28) becomes a bend point of the other first electrode 12a (second electrode 22a). Further, preferably, the first bridge parts 18 (second bridge parts 28) are arranged on an extension of a part Z of the first electrode 12a (second electrode 22a) extending in a straight-line shape from a certain bend point Ka toward an adjacent bend point Kb.

Preferably, the first bridge part 18 (second bridge part 28) of such a wiring type is configured to have a line width identical to a line width of the first electrode 12a (second electrode 22a). As a method of forming the first bridge part 18 (second bridge part 28) of a wiring type, the screen-printing method can be exemplified. Specifically, by using a screen printing plate having predetermined-shaped opening parts corresponding to shapes of the first bridge part 18 (second bridge part 28), and pushing out conductive ink by a squeegee through the opening parts, the first bridge part 18 (second bridge part 28) is formed on the first substrate 11 (second substrate 21) on which the first electrode group 12 (second electrode group 22) is formed. In addition to the screen-printing method, the first bridge part 18 (second bridge part 28) may be formed by using various printing methods such as an ink-jet method, gravure printing, and offset printing. For the conductive ink, conductive ink equivalent to that used for forming the first electrode group 12 and the second electrode group 22 is used. The first bridge part 18 (second bridge part 28) may be formed simultaneously with the first electrode group 12 (second electrode group 22) by using a screen printing plate having predetermined-shaped opening parts corresponding to a pattern shape of the first electrode group 12 (second electrode group 22) and a shape of the first bridge part 18 (second bridge part 28). Instead of using the printing method, the first bridge part 18 (second bridge part 28) and the first electrode group 12 (second electrode group 22) may be formed simultaneously by photolithography.

Figure 11:
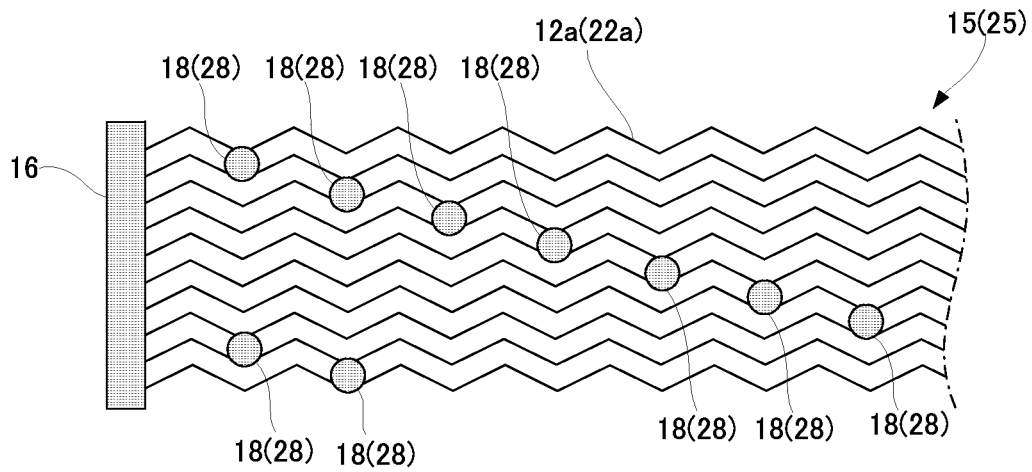
FIG. 11 is an explanatory view for explaining a modification of the touch panel shown in FIG. 1.
Figure 12:
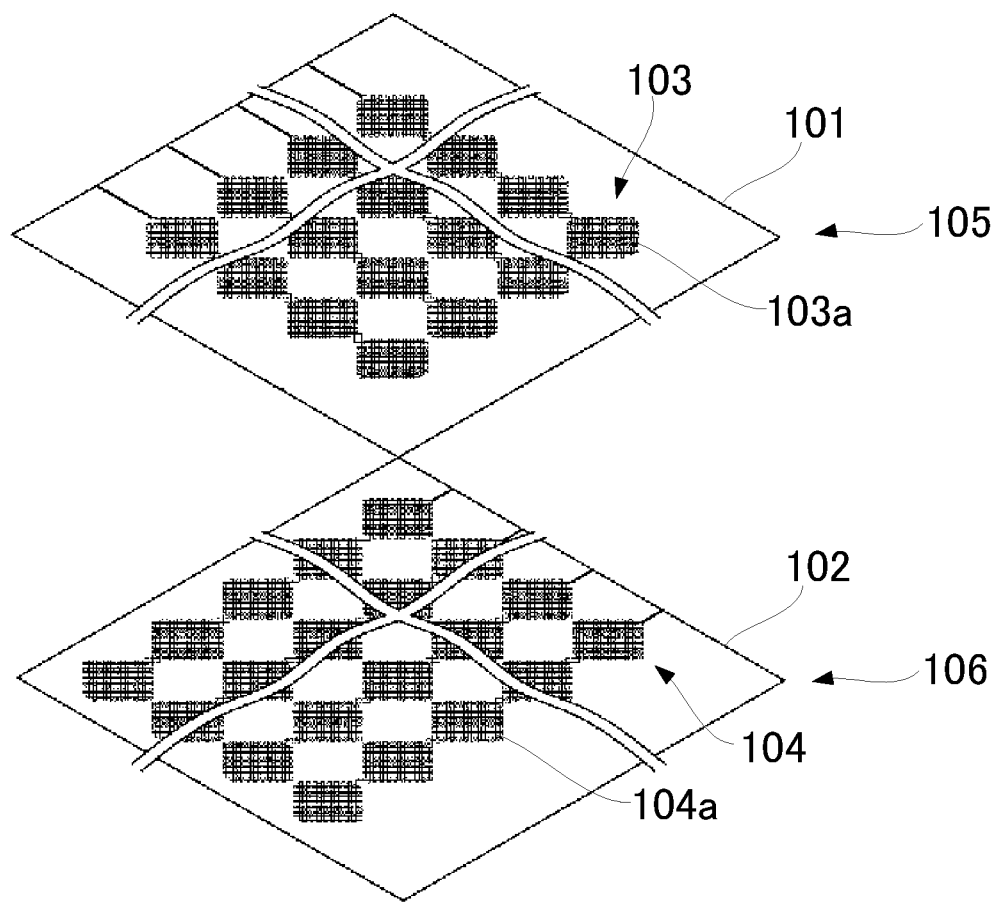
FIG. 12 is an explanatory view for explaining a configuration of a conventional touch panel.
Figure 13:
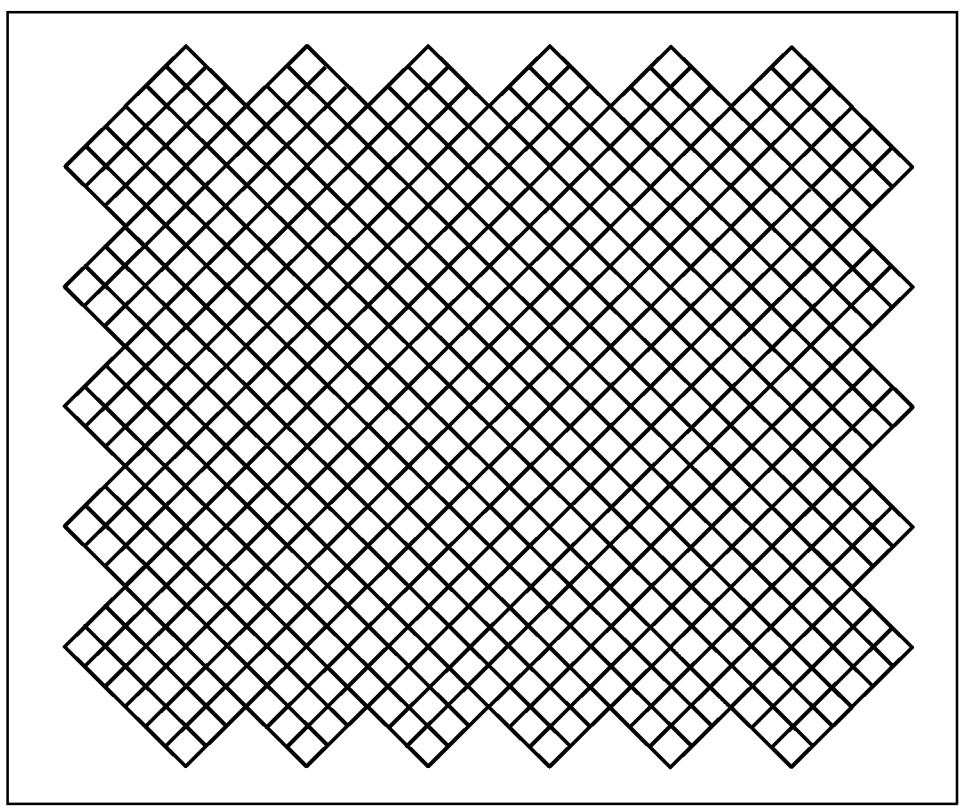
FIG. 13 is a schematic configuration plan view showing the conventional touch panel.
Figure 14:
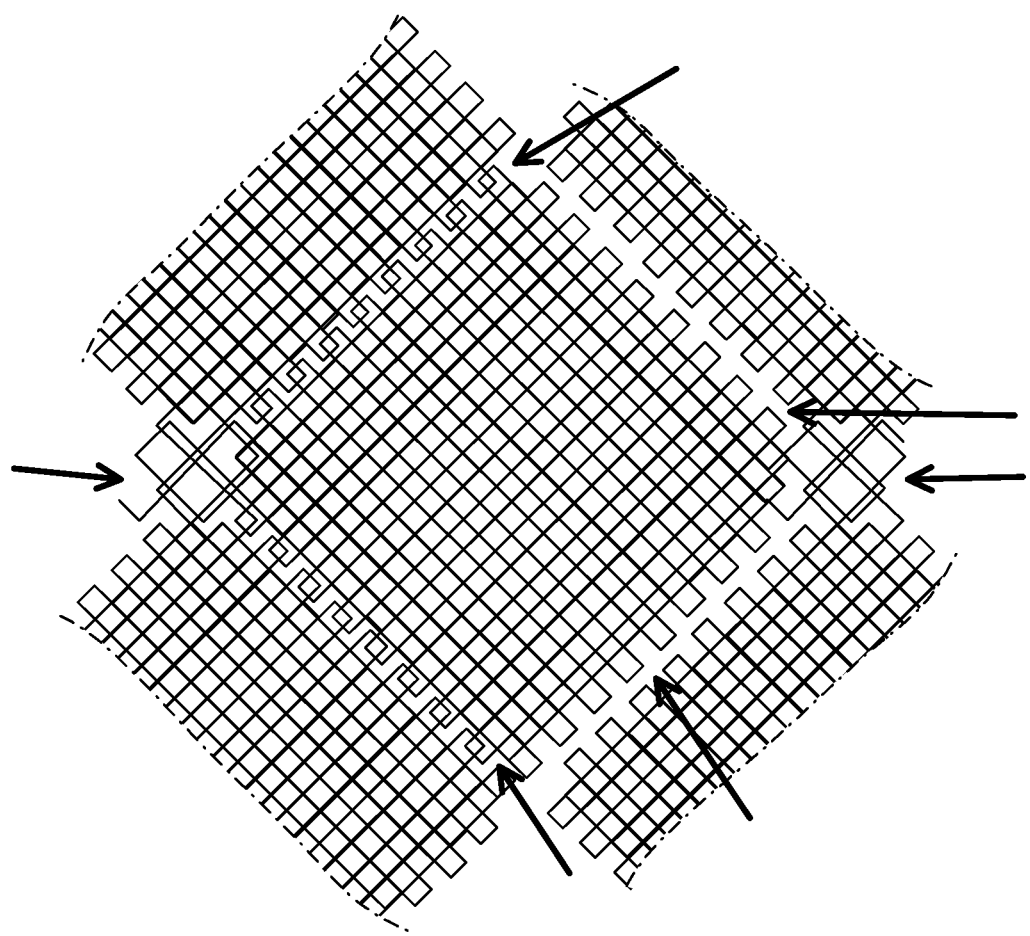
FIG. 14 is an explanatory view for explaining a problem of the conventional touch panel.

The first bridge part 18 (second bridge part 28) can be also formed in a dot type shape as shown in FIG. 11. In FIG. 11, the first bridge part 18 (second bridge part 28) is formed as circular dots in planar view. The first bridge part 18 (second bridge part 28) of such a dot type is formed by transparent conductive ink from the viewpoint of making the first bridge part 18 (second bridge part 28) not easily noticeable. For the transparent conductive ink, there can be used a fluid in which fine particles are uniformly dispersed in a solvent including a resin component and a solution. The fine particles contain, as a main component, indium tin oxide (ITO), conductive oxide (IZO [indium zinc oxide]) having zinc oxide mixed with indium oxide, or conductive oxide (ITSO) having silicon oxide mixed with indium oxide. For a transparent conductive material used for forming other first bridge part 18 (second bridge part 28), there can be used a conductive material that uses, as a conductor, conductive high polymer such as PEDOT (poly-3,4-ethylene dioxythiophene), and a ultra fine conductive fiber such as a carbon nanowire and a metal nanowire. Similarly to the bridge part of a wiring type described above, the first bridge part 18 (second bridge part 28) of a dot type is also formed by various printing methods such as the screen printing, the gravure printing, the offset printing, and the ink-jet method, so that adjacent first electrodes 12a (second electrode 22a) are connected to each other on each first bundle-shaped detection electrode 15 (second bundle-shaped detection electrode 25). A dot shape of a bridge part of a dot type is not limited to a circular shape in planar view, and may be a square shape in planar view or an oblong shape in planar view, for example.

The number of first bridge parts 18 (second bridge parts 28) formed on each first bundle-shaped detection electrode 15 (second bundle-shaped detection electrode 25) may be suitably set so as not to lose visibility, by considering resistances of the first electrodes 12a (second electrodes 22a) and shapes of the first electrodes 12a (second electrode 22a) included in the first bundle-shaped detection electrode 15 (second bundle-shaped detection electrode 25).

DESCRIPTION OF REFERENCE SIGNS 100 touch panel
1 first planar body
11 first substrate
12 first electrode group
12a first electrode
15 first bundle-shaped detection electrode
18 first bridge part
2 second planar body
21 second substrate
22 second electrode group
22a second electrode
25 second bundle-shaped detection electrode
28 second bridge part
3 adhesive layer
K bend point

The invention claimed is:

1. A touch panel having a touch surface region in a plan view thereof, comprising:
   an insulation layer,
   a plurality of first electrodes arranged on one surface side of the insulation layer; and
   a plurality of second electrodes arranged on the other surface side of the insulation layer, wherein
   the first electrodes are formed to extend mutually in a substantially identical direction,
   the second electrodes are formed to extend mutually in a substantially identical direction, along a direction different from the direction in which the first electrodes extend,
   each of the first electrodes and each of the second electrodes are bent-line-shaped electrode wires having a plurality of bend points, and
   when an interior angle of an arbitrary bend point of the first electrode in a bent-line shape is θ1 and an interior angle of an arbitrary bend point of the second electrode in a bent-line shape is θ2, a relationship of the following formula is satisfied:

$$\theta_1 - (180° - \theta_2) > 10°, \quad \text{[Formula]}$$

wherein lattice patterns are formed on the touch surface region with the first and the second electrodes being overlapped with each other such that the lattice patterns include lattices of various shapes, and the lattices of various shapes are substantially uniformly dispersed in the entire touch surface region.

2. The touch panel according to claim 1, wherein
   the first electrodes are formed on one surface of the insulation layer,
   the second electrodes are formed on one surface of a second insulation layer, and
   the insulation layer on which the first electrodes are formed and the second insulation layer on which the second electrodes are formed are arranged in a vertical direction.

3. The touch panel according to claim 1, wherein at least one of the plurality of the first electrodes and at least one of the second electrodes are respectively bent-line-shaped electrode wires having an identical cycle and an identical amplitude.

4. The touch panel according to claim 1, wherein pattern shapes of the plurality of first electrodes and second electrodes are repetition patterns, the pattern shapes each having a single electrode wire width and a single electrode wire pitch.

5. The touch panel according to claim 1, wherein a bundle of a predetermined number of the adjacent first electrodes is configured as a first bundle-shaped detection electrode, and a bundle of a predetermined number of the adjacent second electrodes is configured as a second bundle-shaped detection electrode.

6. The touch panel according to claim 5, wherein both end parts of the first bundle-shaped detection electrode or both end parts of the second bundle-shaped detection electrode are formed with bundling parts that bundle a plurality of the first electrodes constituting the first bundle-shaped detection electrode or a plurality of the second electrodes constituting the second bundle-shaped detection electrode.

7. The touch panel according to claim 5, comprising:
   a first bridge part that connects mutually adjacent first electrodes constituting the first bundle-shaped detection electrode; and a second bridge part that connects mutually adjacent second electrodes constituting the second bundle-shaped detection electrode.

8. A touch panel having a touch surface region in a plan view thereof, comprising:
an insulation layer, a plurality of first electrodes arranged on one surface side of the insulation layer; and
a plurality of second electrodes arranged on the other surface side of the insulation layer, wherein
the first electrodes are formed to extend mutually in a substantially identical direction,
the second electrodes are formed to extend mutually in a substantially identical direction, along a direction different from the direction in which the first electrodes extend,
each of the first electrodes and each of the second electrodes are bent-line-shaped electrode wires having a plurality of bend points,
a bundle of a predetermined number of the adjacent first electrodes is configured as a first bundle-shaped detection electrode, and a bundle of a predetermined number of the adjacent second electrodes is configured as a second bundle-shaped detection electrode,
the touch panel further comprises a first bridge part that connects between mutually adjacent first electrodes constituting the first bundle-shaped detection electrode, and a second bridge part that connects between mutually adjacent second electrodes constituting the second bundle-shaped detection electrode, and
wherein lattice patterns are formed on a touch surface region with the first and the second electrodes being overlapped with each other such that the lattice patterns include lattices of various shapes, and the lattices of various shapes are substantially uniformly dispersed in the entire touch surface region.

9. The touch panel according to claim 8, wherein
the first electrodes are formed on one surface of the insulation layer,
the second electrodes are formed on one surface of a second insulation layer, and
the insulation layer on which the first electrodes are formed and the second insulation layer on which the second electrodes are formed are arranged in a vertical direction.

10. The touch panel according to claim 8, wherein the first electrode and the second electrode are respectively bent-line-shaped electrode wires having an identical cycle and an identical amplitude.

11. The touch panel according to claim 8, wherein when an interior angle of an arbitrary bend point of the first electrode in a bent-line shape is θ1 and an interior angle of an arbitrary bend point of the second electrode in a bent-line shape is θ2, a relationship of the following formula is satisfied:

$$\theta1-(180°-\theta2)>10°.$$ [Formula]

12. The touch panel according to claim 8, wherein pattern shapes of a plurality of the first electrodes and a plurality of the second electrodes are repetition patterns, the pattern shapes each having a single electrode wire width and a single electrode wire pitch.

13. The touch panel according to claim 8, wherein both end parts of the first bundle-shaped detection electrode or both end parts of the second bundle-shaped detection electrode are formed with bundling parts that bundle the plurality of first electrodes constituting the first bundle-shaped detection electrode or the plurality of second electrodes constituting the second bundle-shaped detection electrode.

* * * * *